United States Patent
Thomas et al.

(10) Patent No.: US 9,522,840 B2
(45) Date of Patent: Dec. 20, 2016

(54) BLANK OF $TiO_2$-$SiO_2$ GLASS FOR A MIRROR SUBSTRATE FOR USE IN EUV LITHOGRAPHY AND METHOD FOR THE PRODUCTION THEREOF

(71) Applicant: Heraeus Quarzglas GmbH & Co. KG, Hanau (DE)

(72) Inventors: Stephan Thomas, Großkrotzenburg (DE); Klaus Becker, Hanau (DE); Stefan Ochs, Gelnhausen (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 14/766,276

(22) PCT Filed: Feb. 4, 2014

(86) PCT No.: PCT/EP2014/052106
§ 371 (c)(1),
(2) Date: Aug. 6, 2015

(87) PCT Pub. No.: WO2014/122111
PCT Pub. Date: Aug. 14, 2014

(65) Prior Publication Data
US 2015/0376049 A1    Dec. 31, 2015

(30) Foreign Application Priority Data
Feb. 11, 2013 (DE) .................. 10 2013 101 328

(51) Int. Cl.
*C03C 3/06* (2006.01)
*C03B 19/14* (2006.01)
(Continued)

(52) U.S. Cl.
CPC ............ *C03C 3/06* (2013.01); *C03B 19/1453* (2013.01); *C03B 19/1469* (2013.01);
(Continued)

(58) Field of Classification Search
CPC .................. C03C 2201/23; C03C 2201/42
(Continued)

(56) References Cited

U.S. PATENT DOCUMENTS

| | | | |
|---|---|---|---|
| 7,506,521 B2 * | 3/2009 | Bookbinder | ........ C03B 19/1453 501/53 |
| 7,928,026 B2 * | 4/2011 | Bookbinder | .............. C03C 3/06 501/54 |

(Continued)

FOREIGN PATENT DOCUMENTS

| | | |
|---|---|---|
| DE | 10359102 A1 | 7/2005 |
| DE | 102004015766 A1 | 10/2005 |

(Continued)

OTHER PUBLICATIONS

Pfleiderer et al., "The UV-induced 210 nm absorption band in fused silica with different thermal history and stoichiometry," Journal of Non-Crystalline Solids, vol. 159, pp. 145-153 (1993).

(Continued)

*Primary Examiner* — Noah Wiese
(74) *Attorney, Agent, or Firm* — Panitch Schwarze Belisario & Nadel LLP

(57) ABSTRACT

A blank of $TiO_2$—$SiO_2$ glass for a mirror substrate for use in EUV lithography has a low need for adaptation to optimize the progression of the coefficient of thermal expansion, and consequently also the progression of the zero crossing temperature $T_{zc}$. The $TiO_2$—$SiO_2$ glass has at a mean value of the fictive temperature $T_f$ in the range between 920° C. and 970° C. a dependence expressed as the differential quotient $dT_{zc}/dT_f$ of its zero crossing temperature $T_{zc}$ on the fictive temperature $T_f$ of less than 0.3.

10 Claims, 2 Drawing Sheets

(51) Int. Cl.
  *C03B 32/00* (2006.01)
  *G02B 5/08* (2006.01)
  *G03F 7/20* (2006.01)
  *C03B 25/02* (2006.01)

(52) U.S. Cl.
  CPC .............. *C03B 25/02* (2013.01); *C03B 32/00* (2013.01); *G02B 5/0891* (2013.01); *G03F 7/70316* (2013.01); *G03F 7/70958* (2013.01); *C03B 2201/21* (2013.01); *C03B 2201/23* (2013.01); *C03B 2201/42* (2013.01); *C03C 2201/21* (2013.01); *C03C 2201/23* (2013.01); *C03C 2201/42* (2013.01); *C03C 2203/40* (2013.01); *C03C 2203/52* (2013.01)

(58) Field of Classification Search
  USPC .......................................................... 501/54
  See application file for complete search history.

(56) References Cited

U.S. PATENT DOCUMENTS

| | | |
|---|---|---|
| 2005/0185307 A1 | 8/2005 | Laufer et al. |
| 2005/0215413 A1 | 9/2005 | Alkemper et al. |
| 2006/0137398 A1* | 6/2006 | Bleaking ............. C03B 19/1453 65/17.3 |
| 2009/0143213 A1 | 6/2009 | Hrdina et al. |
| 2010/0028787 A1* | 2/2010 | Koike .................... B82Y 10/00 430/5 |
| 2011/0048075 A1* | 3/2011 | Duran ................... C03B 25/025 65/117 |

FOREIGN PATENT DOCUMENTS

| | | |
|---|---|---|
| DE | 102010039924 A1 | 3/2011 |
| DE | 102010009589 A1 | 9/2011 |
| DE | 102011085358 B3 | 7/2012 |
| EP | 0673888 A1 | 9/1995 |
| EP | 0955565 A2 | 11/1999 |
| WO | 2011078414 A2 | 6/2011 |
| WO | 2011104257 A1 | 9/2011 |

OTHER PUBLICATIONS

Dodd et al., "Optical Determinations of OH in Fused Silica," Journal of Applied Physics, vol. 10, p. 3911 (1966).

Khotimchenko et al., "Determining the Content of Hydrogen Dissolved in Quartz Glass Using the Methods of Raman Scattering and Mass Spectrometry," Zhurnal Prikladnoi Spektroskopii, vol. 46, No. 6, pp. 987-991 (Jun. 1987).

International Search Report (with English translation) and Written Opinion issued Sep. 3, 2014 in International Application No. PCT/EP2014/052106.

International Preliminary Report on Patentability issued Aug. 20, 2015 in International Application No. PCT/EP2014/052106.

* cited by examiner

BLANK OF TIO₂-SIO₂ GLASS FOR A MIRROR SUBSTRATE FOR USE IN EUV LITHOGRAPHY AND METHOD FOR THE PRODUCTION THEREOF

CROSS-REFERENCE TO RELATED APPLICATIONS

This application is a Section 371 of International Application No. PCT/EP2014/052106, filed Feb. 4, 2014, which was published in the English language on Aug. 14, 2014, under International Publication No. WO 2014/122111 A3 and the disclosure of which is incorporated herein by reference.

BACKGROUND OF THE INVENTION

In EUV lithography, highly integrated structures with a line width of less than 50 nm are produced by microlithographic projection devices. Laser radiation from the EUV range (extreme ultraviolet light, also called soft X-ray radiation) is used at wavelengths around 13 nm. The projection devices are equipped with mirror elements which consist of glass having a high silicic acid content and doped with titanium oxide (hereinafter also called $TiO_2$—$SiO_2$ glass) and which are provided with a reflective layer system. These materials are distinguished by an extremely low linear thermal expansion coefficient (shortly called "CTE"; coefficient of thermal expansion) which is adjustable through the concentration of titanium. Standard titanium oxide concentrations are between 6% by wt. and 9% by wt.

Such a blank of synthetic, titanium-doped glass with a high silicic acid content and a manufacturing method therefor are known from DE 10 2004 015 766 A1. The $TiO_2$—$SiO_2$ glass is produced by flame hydrolysis of titanium- and silicon-containing start substances and contains 6.8% by wt. of titanium oxide. It should be noted that the hydroxyl group content of the glass produced in this way is seldom below 300 wt. ppm. To increase the radiation resistance of the glass, it has been suggested that the concentration of the hydrogen present due to the manufacturing process should be lowered by heating to values below $10^{17}$ molecules/cm³. To this end, the glass is heated to a temperature in the range between 400° C. and 800° C. and kept at this temperature for up to 60 hours. One of the plane surfaces of the mirror substrate is provided with a reflective coating, with a plurality of layers being produced one on top of the other.

In the intended use of the mirror substrate, the upper side thereof is provided with a reflective coating. The maximum (theoretical) reflectivity of such an EUV mirror element is about 70%, so that at least 30% of the radiation energy is absorbed in the coating or in the near-surface layer of the mirror substrate and converted into heat. This leads in the volume of the mirror substrate to an inhomogeneous temperature distribution with temperature differences that, according to data given in the literature, may amount to up to 50° C.

Therefore, it would be desirable for a deformation that is as small as possible that the glass of the mirror substrate blank has a CTE that is zero over the whole temperature range of the working temperatures occurring during use. In the case of Ti-doped silica glasses, the temperature range with a CTE around zero can, however, be actually very narrow.

The temperature at which the coefficient of thermal expansion of the glass is equal to zero shall also be called zero crossing temperature or $T_{ZC}$ (temperature zero crossing) hereinafter. The titanium concentration is normally set such that one obtains a CTE of zero in the temperature range between 20° C. and 45° C. Volume regions of the mirror substrate with a higher or a lower temperature than the preset $T_{ZC}$ expand or contract, resulting, despite an altogether low CTE of the $TiO_2$—$SiO_2$ glass, in deformations that are detrimental to the imaging quality of the mirror.

Suggestions have therefore been made for counteracting the deterioration of the optical imaging caused by inhomogeneous temperature distribution in the mirror substrate blank. A metallic substrate material is for instance provided in the mirror known from EP 0 955 565 A2. Thanks to the high thermal conductivity of the metal, the heat introduced into the mirror is efficiently discharged via the back side of the metal substrate, preferably by a cooling device.

Although it is thereby possible to reduce thermally induced mirror deformations, image errors cannot be avoided. Substantial aberrations are still found.

DE 103 59 102 A1 (US 2005/0185307 A1) defines homogeneity requirements for a $SiO_2$—$TiO_2$ glass that are to be satisfied by the glass. For this purpose, the glass shall have a location-dependent thermal longitudinal expansion coefficient defined by the titanium content. Moreover, this coefficient shall be independent as much as possible of the temperature, defined by the amount of the mean rise m of less than $1.5 \times 10^{-9}$ K$^{-2}$. However, it is not indicated how this low temperature dependence of the CTE is achievable.

According to WO 2011/078414 A2, in a blank for a mirror substrate or for a mask plate of $SiO_2$—$TiO_2$ glass, the concentration of titanium oxide over the thickness of the blank is to be adapted step by step or continuously to the temperature distribution arising during operation in such a manner that the condition for the zero crossing temperature $T_{ZC}$ is satisfied at every place, i.e. the coefficient of thermal expansion for the locally evolving temperature is substantially equal to zero. A CTE is here defined as being substantially equal to zero if the remaining longitudinal expansion is 0+/−50 ppb/° C. at every place during operation. This is to be accomplished in that during production of the glass by flame hydrolysis, the concentration of titanium- and silicon-containing start substances is varied such that a predetermined concentration profile is obtained in the blank.

The methods for optimizing the $T_{ZC}$ by local variation of the titanium concentration require precise knowledge of the temperature distribution arising during use over the volume of the component to be optimized and entail enormous design and adaption efforts for the individual component. It should here be noted that a projection lens system contains a plurality of mirrors of different sizes and shapes that have not only flat, but also convexly or concavely curved surfaces which are provided with a reflective coating and have outer contours adapted to the specific use. The temperature profile over the volume of each component to be optimized that is really achieved during operation depends on the specific conditions of use and on the environment and can be determined exactly only in the fully mounted projection lens system under real conditions of use. Technically, however, it is hardly possible to exchange individual components of a fully mounted projection lens system.

This is aggravated by the fact that the CTE and thus the scalable $T_{ZC}$ depend, apart from the titanium oxide content, also on the hydroxyl group content and on the fictive temperature of the glass. The fictive temperature is a glass property that represents the degree of order of the "frozen" glass network. A higher fictive temperature of the $TiO_2$—$SiO_2$ glass is accompanied by a lower degree of order of the glass structure and a greater deviation from the energetically most advantageous structural arrangement.

The fictive temperature is influenced by the thermal history of the glass, particularly by the latest cooling process. There are bound to be other conditions for near-surface regions of a glass block than for central regions, so that different volume regions of the mirror substrate blank already have different fictive temperatures due to their different thermal histories. The distribution of the fictive temperature over the blank volume is therefore always inhomogeneous. A certain equalization of the profile of the fictive temperature is achievable by way of annealing. However, annealing processes are troublesome in terms of energy and time.

This is further aggravated by the fact that the resulting fictive temperature also depends on the composition of the $TiO_2$—$SiO_2$ glass, and particularly on the hydroxyl group content and the titanium oxide concentration. Even with a very careful and long annealing process, the profile of the fictive temperature over the blank volume cannot be homogenized when the composition is not completely homogeneous. This, however, is not readily applicable especially in the case of a hydroxyl group content that can be varied by drying measures.

BRIEF SUMMARY OF THE INVENTION

It is the object of the present invention to provide a blank for a mirror substrate made of a $TiO_2$—$SiO_2$ glass, in which the adjustment requirements for optimizing the profile of the CTE and, thus also the $T_{ZC}$ profile, are small.

Furthermore, it is the object of the present invention to provide a method for producing the blank according to the invention.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

The present invention relates to a blank of $TiO_2$—$SiO_2$ glass for a mirror substrate for use in EUV lithography. Furthermore, the present invention relates to a method for producing such a blank or a shaped body as semifinished product for the production thereof.

In the blank according to the invention, the $TiO_2$—$SiO_2$ glass at a mean value of the fictive temperature $T_f$ in the range between 920° C. and 970° C. shows a dependence of its zero crossing temperature $T_{ZC}$ on the fictive temperature $T_f$ that, expressed as differential quotient $dT_{zc}/dT_f$, is less than 0.3.

An inhomogeneous distribution of the fictive temperature over the volume of the blank aggravates the adjustment of a CTE and $T_{ZC}$ distribution that is as homogeneous as possible. Instead of a complicated equalization of the fictive temperature over the blank volume or a complicated adaptation of the CTE to a given profile of the fictive temperature, the invention aims at a certain decoupling of the dependence of the CTE and thus of the zero crossing temperature $T_{ZC}$ from the fictive temperature. This measure is neither known nor rendered obvious in the prior art and can already be regarded as a first step towards the invention.

As a rule, $TiO_2$—$SiO_2$ glasses show a decrease in the CTE and an increase in the $T_{ZC}$ with the fictive temperature. The decoupling of the dependence of the $T_{ZC}$ on the fictive temperature is shown in a diagram in which $T_{ZC}$ is plotted against the fictive temperature, thus in a flat gradient of the function $T_{ZC}=f(T_f)$. According to the invention, this tangent slope is less than 0.3, preferably less than 0.25, at every point within the interval of the fictive temperature of 920-970° C.

This is a material-specific property. It is present in the blank of the invention independently of whether its mean fictive temperature is really within this temperature interval. For instance, if a higher fictive temperature is set, this may lead to gradients of the function $T_{ZC}=f(T_f)$ in which the differential quotient is higher than 0.3. The blank according to the invention is recognizable by the fact that the desired decoupling is ensured if it has a mean fictive temperature in the range between 920° C. and 970° C.

Figure 2:
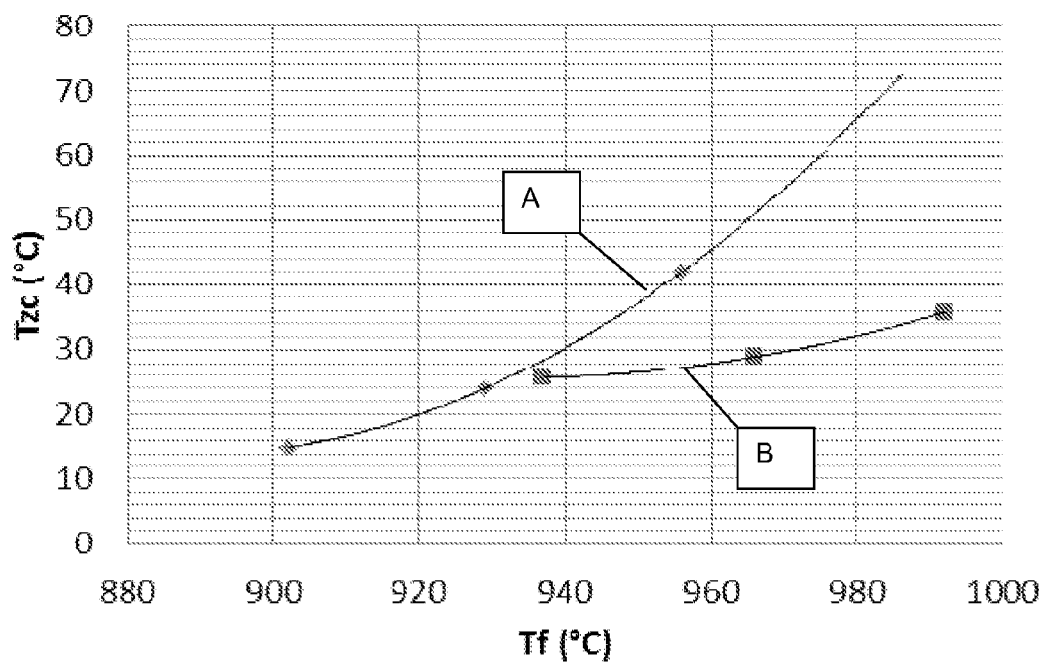
FIG. 2 a diagram showing the dependence of the zero crossing temperature $T_{ZC}$ on the fictive temperature $T_f$ for different $TiO_2$—$SiO_2$ glasses, i.e., their specific function $T_{ZC}=f(T_f)$.

The diagram of FIG. 2 compares the function $T_{ZC}=f(T_f)$ for a commercially available $TiO_2$—$SiO_2$ glass (curve A) and a $TiO_2$—$SiO_2$ glass according to the invention (curve B). Curve B shows a tangent slope of less than 0.3, expressed by the differential quotient $dT_{zc}/dT_f$ at each point within the temperature interval of 920° C. to about 990° C., whereas curve A does not show such a small slope at any point within this interval.

For the $TiO_2$—$SiO_2$ glass of the blank according to the invention, this demonstrates a certain insensitivity of the $T_{ZC}$ to the fictive temperature, which is here also designated as a "decoupling" of the dependence of the zero crossing temperature from the fictive temperature. With this decoupling, a blank can be used for producing a deformation-resistant mirror substrate despite a profile of the fictive temperature that otherwise would no longer be acceptable or would have to be compensated under great efforts by adapting the progression of the CTE (e.g., by changing the concentrations of titanium oxide or of hydroxyl groups). Thus, the demands made during annealing on the adjustment of a fictive temperature progression that is as homogeneous as possible are smaller, or one obtains a more homogeneous distribution of the $T_{ZC}$ (as far as it is due to the fictive temperature), with the same efforts.

A standard measurement method for determining the fictive temperature on the basis of a measurement of the Raman scattering intensity at a wave number of about 606 cm$^{-1}$ is described in Ch. Pfleiderer et. al. ("The UV-induced 210 nm absorption band in fused silica with different thermal history and stoichiometry"; Journal of Non-Cryst. Solids 159; pp. 143-145 (1993)).

The desired decoupling is achieved by way of a specific method for producing the $TiO_2$—$SiO_2$ glass, which shall be explained in more detail further below.

The degree of decoupling of the dependence of the $T_{ZC}$ from the fictive temperature depends to a certain extent on the absolute level of the fictive temperature itself. At a lower fictive temperature, the desired decoupling is more easily achieved than at a higher fictive temperature. The demands are therefore higher, and the achieved decoupling can be particularly noticed, when the fictive temperatures of the blank are in the upper range of the temperature interval, e.g., above 940° C.

Under the same annealing treatment, the fictive temperature substantially depends again on the hydroxyl group content. The higher the hydroxyl group content, the lower is the evolving fictive temperature under the same annealing treatment. If one just aimed at setting a fictive temperature that is as low as possible, a high hydroxyl group content would per se have to be preferred. On the other hand, hydroxyl groups are undesired to a certain degree for the achievement of other, particularly optical or mechanical, properties. It has turned out to be useful as a suitable compromise between these other properties and a low fictive temperature when the $TiO_2$—$SiO_2$ glass has a mean hydroxyl group content in the range of 200-300 wt. ppm.

This is a medium hydroxyl group content. A precondition for the setting of this mean hydroxyl group content is the manufacture of the $TiO_2$—$SiO_2$ glass according to the so-called "soot method." A porous soot body which contains hydroxyl groups due to the manufacturing method is here obtained as an intermediate product. These groups may be removed to the desired extent by reactive chemical treatment with halogens. Preferably, drying is however carried out by thermal treatment of the soot body under vacuum.

The hydroxyl group content (OH content) is determined by measurement of the IR absorption according to the method presented by D. M. Dodd et al. ("Optical Determinations of OH in Fused Silica"; pp. 3911 (1966)).

Moreover, it has turned out to be advantageous when the $TiO_2$—$SiO_2$ glass has a mean hydrogen concentration of less than $5\times10^{16}$ molecules/cm³, preferably a mean hydrogen concentration of less than $1\times10^{16}$ molecules/cm³.

The mean hydrogen concentration is determined by Raman measurements. The applied measurement method is described in Khotimchenko et al.; ("Determining the Content of Hydrogen Dissolved in Quartz Glass Using the Methods of Raman Scattering and Mass Spectrometry" *Zhurnal Prikladnoi Spektroskopii*, Vol. 46, No. 6; pp. 987-991 (June 1987).

On account of the above-explained decoupling of $T_{ZC}$ and fictive temperature, the mirror substrate blank of $TiO_2$—$SiO_2$ glass according to the invention is relatively insensitive to an inhomogeneous distribution of the fictive temperature over the volume of the blank. Therefore, the generally small thermal and spatial dependence also facilitates the adaptation of the $T_{ZC}$ to an inhomogeneous temperature profile which is obtained during practical use.

A further adaptation is intended in a preferred embodiment where the blank is defined by an upper side and a bottom side, wherein the $TiO_2$—$SiO_2$ glass between the upper side and bottom side shows an inhomogeneous profile of the titanium-oxide concentration.

In this embodiment of the blank according to the invention, the titanium oxide concentration of the glass is varied as a supplement to the inhomogeneous profile of the fictive temperature, and the $T_{ZC}$ is thereby e.g., adapted to the temperature evolving during operation.

The blank is configured as a composite body which comprises a first shaped body of $TiO_2$—$SiO_2$ glass having a first titanium-oxide concentration and a second shaped body of $TiO_2$—$SiO_2$ glass having a second titanium-oxide concentration that is connected to the first shaped body.

In the simplest case, two shaped bodies are enough for adapting the titanium dioxide concentration and the $T_{ZC}$ to the inhomogeneous temperature profile with adequate accuracy during operation.

The shaped bodies used as semifinished products consist of $TiO_2$—$SiO_2$ glass according to the present invention, but with different titanium-oxide concentrations. For finishing the mirror substrate blank (or a part thereof) the shaped bodies are bonded to one another with the help of known methods.

A higher fictive temperature has the same effect on the $T_{ZC}$ as a higher titanium-oxide concentration, i.e., it is $T_{ZC}$-increasing for the respective $TiO_2$—$SiO_2$ glass.

Accordingly, in an advantageous embodiment of the blank according to the invention, the fictive temperature is also used for adapting the $T_{ZC}$ to a given temperature profile. The first shaped body has a first mean fictive temperature and the second shaped body has a second mean fictive temperature; the first and the second fictive temperatures are different from each other. Apart from the fictive temperature and the titanium-oxide concentration, the hydroxyl group content also has an impact on the $T_{ZC}$ and can be used as an additional parameter for adaptation to the given temperature progression.

For the adjustment of the respective fictive temperature, the first and second shaped bodies are subjected to an annealing process prior to their joining in such a manner that the evolving fictive temperatures differ from one another.

The shaped bodies are designed in the form of a plate with a thickness of not more than 60 mm.

In the determination of CTE and titanium-oxide concentration on plate-like shaped bodies, a measurement value that is averaged over the thickness is more significant than a measurement over the larger thickness of the complete mirror substrate blank. The thinner the shaped body (more exactly, the shorter the measurement path), the more significant and more exact is the average value measured.

The method for producing the blank according to the invention comprises the following method steps according to the invention:
(a) producing a first porous soot body of $SiO_2$ with a first concentration of titanium oxide by flame hydrolysis of silicon- and titanium-containing start substances,
(b) drying and sintering the first soot body to obtain such that a first $TiO_2$—$SiO_2$ glass with the first titanium oxide concentration is obtained, in which the mean hydroxyl group content is set to less than 300 wt. ppm,
(c) homogenizing the first $TiO_2$—$SiO_2$ glass in a homogenizing process by heating the $TiO_2$—$SiO_2$ glass in an atmosphere having an oxidative effect to a temperature of more than 2000° C., to softened and reshape the glass, resulting in a mean hydrogen concentration of less than $5\times10^{16}$ molecules/cm³,
(d) shaping the first $TiO_2$—$SiO_2$ glass which has a mean hydroxyl group content in the range of 200-300 wt. ppm and a mean hydrogen concentration of less than $5\times10^{16}$ molecules/cm³ to obtain a shaped body, and
(e) annealing the shaped body such that the $TiO_2$—$SiO_2$ glass at a mean fictive temperature $T_f$ in the range between 920° C. and 970° C. shows a dependence of its zero crossing temperature $T_{ZC}$ on the fictive temperature $T_f$ that, expressed as differential quotient $dT_{ZC}/dT_f$, is less than 0.3.

The shaped body of $TiO_2$—$SiO_2$ glass obtained thereby can be used directly as a mirror substrate blank after mechanical processing, such as grinding and polishing, or serve as a preliminary product for further processing into the blank. Owing to its structure and chemical composition, the $TiO_2$—$SiO_2$ glass produced thereby shows a CTE and a zero crossing temperature $T_{ZC}$ which are relatively insensitive to an inhomogeneous distribution of the fictive temperature over the volume of the blank, and therefore permit a relatively simple constructional design for adaptation of the thermal expansion to a temperature distribution over the thickness of the blank that is evolving during practical use. This shall be explained in more detail hereinafter.

Impact of the Chemical Composition and the Glass Structure on $T_{ZC}$

The coefficient of thermal expansion CTE and the zero crossing temperature $T_{ZC}$ of $TiO_2$—$SiO_2$ glass depend on the titanium concentration, on the hydroxyl group content, and on the fictive temperature.

Since the fictive temperature depends on the thermal history of the glass, it is always inhomogeneous, viewed over the volume of the mirror substrate blank, and may in principle be more or less adapted only by way of energy- and time-consuming annealing processes. The method according to the invention allows the manufacture of a $TiO_2$—$SiO_2$ glass that shows a low dependence of CTE and $T_{ZC}$ on the fictive temperature, so that a certain decoupling is achieved in this respect.

The mean hydroxyl group content of the $TiO_2$—$SiO_2$ glass in the range of 200-300 wt. ppm is adjustable in the manufacture of the glass according to the so-called "soot method." A porous soot body which contains a large amount of hydroxyl groups is obtained as the intermediate product. These can be removed by reactive chemical treatment with halogens. Preferably, however, drying is carried out by way of thermal treatment of the soot body under vacuum.

As for the chemical composition of the $TiO_2$—$SiO_2$ glass and its impact on the dependence of the CTE on the temperature, the soot method, however, turns out to be disadvantageous under another aspect. Relatively low temperatures of around 1500° C. are adequate for the vitrification of the soot body. It has been found that microcrystals of rutile ($TiO_2$) form in the $TiO_2$—$SiO_2$ glass, resulting in regions of high titanium dioxide concentration that have impacts on the thermal expansion of the glass. These microcrystals have a melting point of 1855° C.

It is provided according to the invention that $TiO_2$—$SiO_2$ glass obtained after vitrification is heated to a temperature at which the rutile microcrystals melt. At the same time, the glass is deformed and homogenized, for instance by twisting, so as to achieve a more homogeneous distribution of the $TiO_2$-rich regions. To this end, the $TiO_2$—$SiO_2$ glass is subjected to a homogenizing process in which it is heated to a temperature of more than 2000° C. and is softened and reshaped in this process.

This has the effect that a quite homogeneous titanium dioxide distribution is achieved over the volume of the $TiO_2$—$SiO_2$ glass and that the spatial dependence of the CTE is reduced due to rutile-microcrystal concentrations.

On the other hand, the high temperatures during homogenization may bring about a partial reduction of $Ti^{4+}$ into $Ti^{3+}$. It has been found that the oxidation state of titanium oxide influences the coordination of the ion within the network structure, and that this change has an unfavorable impact on the distribution of the titanium oxide, similar to the rutile formation. Therefore, according to the invention, an atmosphere with an oxidative effect is set during homogenization at least temporarily. A gas, such as oxygen, with an oxidative effect is here provided in excess in the area of the softened glass mass, and a partial reduction of $Ti^{4+}$ into $Ti^{3+}$ is thus counteracted.

It is thereby ensured that the shaped bodies produced according to method step (d) from the respective $TiO_2$—$SiO_2$ glass show a substantially homogeneous distribution of titanium oxide, namely with titanium in the tetravalent oxidation state.

At the same time, the hydrogen contained due to the manufacturing process is reduced because of the high temperature and the atmosphere with the oxidative effect, so that a very low hydrogen concentration of less than $5\times10^{16}$ molecules/cm$^3$, preferably less than $1\times10^{15}$ molecules/cm$^3$, is obtained on average in the $TiO_2$—$SiO_2$ glass.

During this homogenizing process the $TiO_2$—$SiO_2$ glass may be brought into an almost finished form, e.g., into plate form. This shaping, however, is often carried out in a separate shaping process.

The shaped body obtained by shaping normally exhibits a very inhomogeneous distribution of the fictive temperature over its volume. To achieve a certain equalization of the fictive temperature and to set values in the range of 920° C. to 970° C., the shaped body is annealed. Annealing methods that are suited for setting a fictive temperature in this temperature range have to be developed in a few simple tests. Also after the annealing process, the evolving fictive temperatures differ from one another in the near-surface region of upper side and bottom side and from the fictive temperature in the volume (in the middle of the shaped body), with the difference depending on the volume and thickness of the blank and being in the range of a few degrees, typically around 5° C., at thicknesses around 150 nm.

The $TiO_2$—$SiO_2$ glass produced and finished by the above-mentioned measures is distinguished by a hydroxyl group content and a hydrogen concentration, as have been specified above, and particularly by a zero crossing temperature $T_{ZC}$, which in the interval between 920° C. and 970° C. depends on the fictive temperature to such a low degree as has so far not been known. This low dependence is expressed as the differential quotient $dT_{ZC}/dT_f$, which is less than 0.3. Preferably, the first $TiO_2$—$SiO_2$ glass in the homogenization process according to method step (c) is heated at least temporarily with a burner flame which is fed with fuel gas and with at least one oxidizing component at an amount in excess for the complete combustion of the fuel gas.

In the burner flame a gas mixture of fuel gas and of a component oxidizing the fuel gas, particularly oxygen, is burnt. It is ensured by the excess of oxidizing component in the gas mixture, on the one hand, that the fuel gas burns completely and that an excess amount remains that counteracts a partial reduction of titanium$^{4+}$ oxide.

The decoupling of the $T_{ZC}$ from the fictive temperature achieved thereby substantially alleviates the problem that the fictive temperature has also to be taken into account as a parameter in the adaptation to an inhomogeneous distribution of the operating temperature evolving during use, and therefore simplifies this adaptation process.

If the adaptation to an inhomogeneous distribution of the operating temperature is carried out via the composition of the $TiO_2$—$SiO_2$ glass, such as the Ti concentration or the hydroxyl group content, this automatically also changes the fictive temperature of the glass blank, i.e., both with respect to the absolute value and the distribution thereof over the volume. These changes in the fictive temperature, in turn, have an impact on $T_{ZC}$; they complicate the adaptation and the correct setting of the $T_{ZC}$ over the volume. This disturbing influence of the fictive temperature is alleviated by the use of the blank according to the invention, for changes in the fictive temperature thereby have a smaller impact on the profile of the $T_{ZC}$. Thus, the glass composition can be adjusted to the desired $T_{ZC}$ in a more targeted manner, i.e., with a reduced disturbing effect by the fictive temperature.

The adaptation to an inhomogeneous distribution of the operating temperature is preferably carried out by way of glass layers that differ in their titanium oxide concentration. The glass layers are obtained in that prefabricated, particularly plate-like, shaped bodies are interconnected. The prefabricated shaped bodies have to be characterized more accurately with the help of the standard measurement technology than the finished mirror substrate. Thus, the titanium dioxide concentration and the CTE may be measured relatively easily optically or by way of ultrasonic measurement. A value averaged over the measurement path is however obtained. By comparison with the measurement on the complete mirror substrate blank, the averaged measurement value is more relevant in the measurement on the plate-like shaped bodies present in the intermediate stage. In the $TiO_2$—$SiO_2$ glass according to the invention the changes in the titanium-dioxide concentration cause changes in the fictive temperature; these, however, have a smaller impact on the setting of the $T_{ZC}$ than is otherwise customary.

A few particularly preferred method modifications shall now be explained in more detail.

The soot body is preferably dried by heating the respective soot body under vacuum to a temperature of at least 1150° C., preferably at least 1200° C.

The treatment period that is needed for eliminating the hydroxyl groups down to a content ranging between 200-300 wt. ppm is shortened by using a high treating temperature.

It has turned out to be useful if the homogenizing process according to method step (c) comprises twisting, in which a cylindrical start body from the respective $TiO_2$—$SiO_2$ glass which is held between two holders is heated zone by zone to a melting temperature and the heated zone is processed by relative movement of the two holders with respect to each other so as to form a twisted body that is homogenized in three directions.

To this end, the start body is clamped in a glass lathe equipped with one or a plurality of heat burners and homogenized by a shaping process, as described in EP 673 888 A1, for the purpose of completely removing layers. In the modification of this method according to the invention, the start body is locally heated by a heat burner with an oxidizing burner flame to more than 200° C. and thereby softened. The start body is twisted by relative movement of the two holders relative to each other about its longitudinal axis in several directions, with the softened glass mass being thoroughly blended. With this homogenizing process, rutile microcrystals that are present in the start body are fused, a reduction of $Ti^{4+}$ into trivalent $Ti^{3+}$ and an accompanying change of the coordination are avoided, so that a uniform distribution of the titanium oxide concentration on the whole is obtained.

When two or more shaped bodies are joined, a planar contact surface of the first shaped body and a planar contact surface of the second shaped body are joined by optical contact bonding and welded to each other.

This is a "cold bonding method" in which at best the direct region of the contact surface is subjected to significant heating. Since this joining method does not require a hot step, the preset characteristics, especially with respect to the setting of CTE and fictive temperature, are no longer changed.

As an alternative, the bonding may comprise a bonding step in which the upper shaped body resting on the second shaped body is softened in a furnace and deformed together with the body.

This is a "hot bonding method" in which the individual shaped bodies, such as plates or rods, are joined together by welding. An adjuvant may be introduced between the contact surfaces to facilitate material-to-material bonding, for instance a slurry with particles of $TiO_2$—$SiO_2$ glass. A previously set fictive temperature may, however, change due to the joining process at a high temperature. If necessary, the ready-joined mirror substrate is treated in a subsequent annealing step. Depending on the chemical composition of the original shaped bodies, different fictive temperatures are normally obtained.

Figure 1:
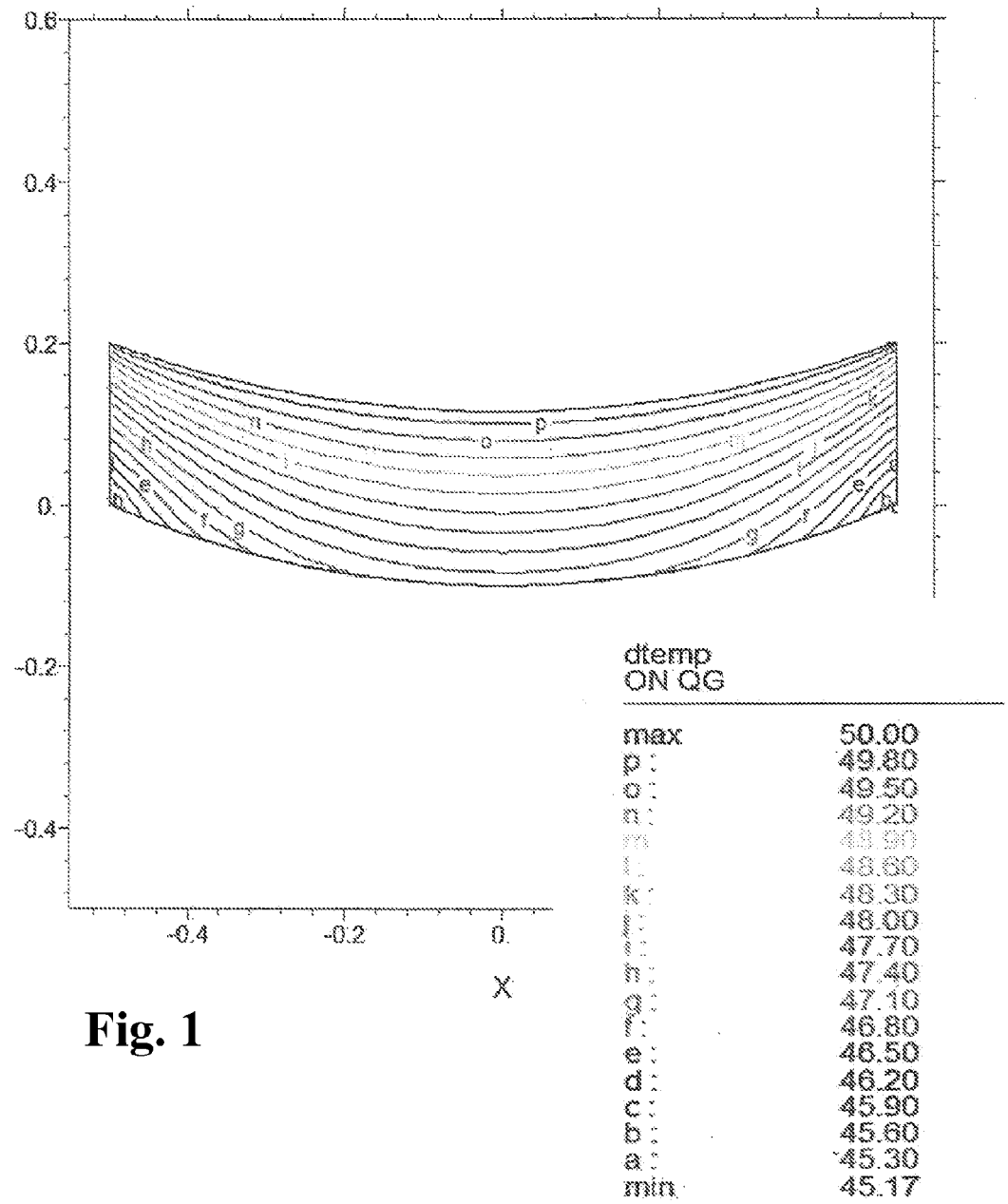
FIG. 1 a diagram illustrating the temperature stratification in a mirror substrate with curved surfaces.

The diagram of FIG. 1 shows the temperature distribution in a circular mirror substrate with curved surfaces, as is obtained in thermal equilibrium when one assumes a temperature of 50° C. on the surface. "X" designates the radius, and the scale of the y-axis indicates the thickness, each time in m. Although the maximum temperature difference is only 5° Celsius, it exists not only between the upper side and the bottom side of the substrate, but also between upper side and side edge.

This temperature distribution demonstrates the great efforts required for varying the titanium oxide concentration within a substrate if the $T_{ZC}$ is to be adapted exactly to the temperature distribution only via the titanium oxide concentration. Another aggravating factor is that due to the manufacturing process, mirror substrate blanks of glass show a certain variation of their fictive temperature over their volume; this variation has an impact on the CTE.

The mirror substrate blank according to the invention shows a smaller temperature dependence of the CTE on the fictive temperature, so that these adaptation efforts are not at all required or are at least smaller. This shall be explained hereinafter with reference to examples.

Production of Shaped Bodies with Different Titanium-Oxide Concentration and Fictive Temperature Sample 1a: Plate of $TiO_2$—$SiO_2$ Glass A soot body which consists of synthetic $TiO_2$—$SiO_2$ glass doped with about 8% by wt. of $TiO_2$ is produced with the help of the known OVD method by flame hydrolysis of octamethylcyclotetrasiloxane (OMCTS) and titanium-isopropoxide [$Ti(OPr^i)_4$] as feedstock material for forming $SiO_2$—$TiO_2$ particles.

The soot body is dehydrated under vacuum at a temperature of about 1150° C. ($T_{dying}$) in a heating furnace with a heating element of graphite. The graphite provided in the heating furnace causes the setting of reducing conditions. The dehydration treatment ends after 2 hours ($t_{drying}$).

Subsequently, the dried soot body is vitrified in a sintering furnace at a temperature of about 1500° C. under vacuum ($10^{-2}$ mbar) into a transparent blank of $TiO_2$—$SiO_2$ glass. The mean hydroxyl group content of the glass is about 250 wt. ppm.

The glass is subsequently homogenized by thermo-mechanical homogenization (twisting) and formation of a cylinder of $TiO_2$—$SiO_2$ glass. To this end, a rod-shaped start body is clamped in a glass lathe equipped with an oxyhydrogen burner and is homogenized in a shaping process, as described in EP 673 888 A1, for the complete removal of layers. The start body is here heated by means of the oxyhydrogen burner locally to more than 200° C. and softened in this process. 1.8 moles of hydrogen per 1 mole of oxygen are here supplied to the oxyhydrogen burner and an oxyhydrogen flame with an oxidizing effect is thereby produced.

The start body is twisted about its longitudinal axis by relative movement of the two holders with respect to each other, the softened glass mass being thoroughly mixed in a radial direction to form a twisted body. One obtains an elongated twisted body with a diameter of about 90 mm and a length of about 635 mm. In a further shaping process, the twisted body is compressed into a ball-shaped mass, and the contact points of the holders on the ball-shaped mass are shifted by 90 degrees. A further twisted body is obtained by drawing the holders apart and by mutual turning. This shaping process will be repeated until a blank is obtained that is homogenized in all dimensions. The $TiO_2$—$SiO_2$ glass homogenized in this way is free of striae in three directions, it does not contain rutile microcrystals, and it shows a homogeneous titanium-oxide concentration.

A round plate of $TiO_2$—$SiO_2$ glass with a diameter of 30 cm and a thickness of 5.7 cm is thereby formed from the blank.

For reducing mechanical stresses and for setting a given fictive temperature the glass plate is subjected to an annealing temperature. The glass plate is heated in air and at an atmospheric pressure to 1080° C. ($T1_{annealing}$) for a holding time of 8 hours ($t1_{annealing}$) and is subsequently cooled down at a cooling rate of 4° C./h to a temperature of 950° C. ($T2_{annealing}$) and kept at this temperature for 4 hours ($t2_{annealing}$). Thereupon, the $TiO_2$—$SiO_2$ glass plate is cooled down at an increased cooling rate of 50° C./h to a temperature of 300° C., whereupon the furnace is switched off and the glass plate is allowed to cool freely in the furnace.

For the further treatment, the damaged surface layer of the glass plate is removed and a plane side is polished, resulting in a diameter of 29.4 cm and a thickness d of 5.1 cm.

The plate obtained thereby (Sample 1a) consists of a homogenized $TiO_2$—$SiO_2$ glass of a particularly high quality that contains 7.7% by wt. of titanium oxide. The hydroxyl group content amounts to 250 wt. ppm, and a mean value of $1 \cdot 10^{16}$ molecules/cm$^3$ is determined for the hydrogen concentration. The mean fictive temperature measured over the whole thickness is 968° C.

Two further glass plates (Samples 1b and 1c) are produced from the same $TiO_2$—$SiO_2$ glass and with the help of the same manufacturing method. The only difference lies in the annealing method. In Sample 1b, $t2_{annealing}$ is shorter and in Sample 1c $t2_{annealing}$ is slightly longer than in Sample 1. The Samples show the following mean fictive temperatures measured over the thickness:

Sample 1a: 968+/−2.5° C.
Sample 1b: 993+/−5.1° C.
Sample 1c: 938+/−4.2° C.

For these samples, the mean coefficient of thermal expansion is determined by interferometry with the help of the method described in R. Schödel ("Ultra-high accuracy thermal expansion measurements with PTB's precision interferometer"; *Meas. Sci. Technol.* 19; 084003; 11 pp; (2008)). The respective $T_{ZC}$ of the Samples is obtained in the known manner arithmetically from the CTE values measured in this way.

Samples were also cut from commercially available $TiO_2$—$SiO_2$ glass with a titanium-oxide content of 7.4% by wt. and with a hydroxyl group content of 880 wt. ppm, and these were measured. Possibly due to the increased hydroxyl group content, the fictive temperature is slightly lower in all of these samples. After annealing, it varies between about 902° C. and 957° C. in three samples taken.

The diagram of FIG. 2 shows a comparison of the two measurement series. Curve A connects the measurement values of the samples taken from the commercially available $TiO_2$—$SiO_2$ glass, and curve B the measurement values of Samples 1a, 1b and 1c for the $TiO_2$—$SiO_2$ glass according to the invention. On the ordinate, the zero crossing temperature $T_{ZC}$ (in ° C.) is plotted against the fictive temperature $T_f$ measured (in ° C.).

Curve B shows a comparatively flat profile. Both the gradient of the function and $T_{ZC}$ slightly increase with the fictive temperature and reach a maximum with $T_{ZC}$=36° C. at a fictive temperature of around 993° C.

Figure 3:
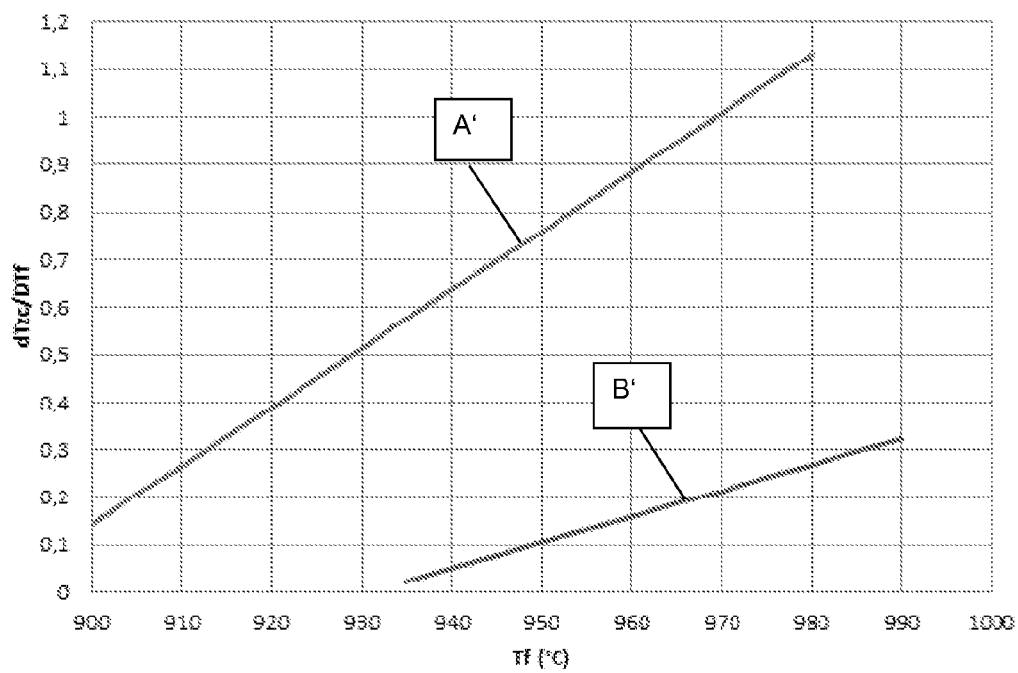
FIG. 3 a diagram with derivatives (tangent slopes) of the specific functions $T_{ZC}=f(T_f)$ from the diagram of FIG. 2.

The diagram of FIG. 3 shows the derivatives of the curves A and B of FIG. 2. The differential quotient $dT_{ZC}/dT_f$ is plotted against the fictive temperature $T_f$. Curve A' shows the tangent slope of the function of curve A, and curve B' shows the tangent slope of curve B1. It can be learned from this that the tangent slope of curve B is about 0.35 in the measurement value of the fictive temperature around 993° C. (differential quotient $dT_{ZC}/dT_f$=0.35). At fictive temperatures of less than 980° C. the differential quotient $dT_{ZC}/dT_f$ is however below 0.3.

By comparison, the measurement curve A shows a steeper curve of the $T_{CZ}$ with the fictive temperature. As can be seen in FIG. 3, the differential quotient $dT_{ZC}/dT_f$ is nowhere smaller than 0.3 in the $T_f$ interval of 920° C. to 970° C. and only reaches this value at fictive temperatures of less than 915° C. This shows the increased dependence of the $T_{ZC}$ on the fictive temperature in the commercially available $TiO_2$—$SiO_2$ glass.

In connection with the elimination of rutile microcrystals, the reduction or prevention of $Ti^{3+}$ formation and the accompanying homogenization of the titanium-oxide concentration, this reduced sensitivity of the $TiO_2$—$SiO_2$ glass produced according to the invention allows not only a more precise, simpler and more homogeneous adjustment of the coefficient of thermal expansion within the shaped body, but also a constructively very simple adaptation of the mirror substrate blank to the $T_{ZC}$.

Samples 2 and 3: Further Plates of $TiO_2$—$SiO_2$ Glass

As explained with reference to Sample 1a, soot bodies of synthetic $TiO_2$—$SiO_2$ glass with different concentrations of $TiO_2$ are produced by flame hydrolysis of OMCTS and titanium-isopropoxide [Ti(OPr$^i$)$_4$]. The concentrations are indicated in Table 1.

Like in Sample 1a, the soot bodies are each dehydrated under vacuum at a temperature of 1150° C. in a heating furnace with a heating element of graphite.

The dried soot bodies are vitrified at about 1500° C. under vacuum ($10^{-2}$ mbar) into transparent blanks of $TiO_2$—$SiO_2$ glass. The mean hydroxyl group content of the titanium-doped silica glasses is each time approximately 250 wt. ppm.

The glasses obtained in this way are subsequently further processed by thermo-mechanical homogenization (twisting) in an oxidizing atmosphere. Sample 2 is here homogenized in three directions (as explained with reference to Sample 1a; in Table 1, this type of homogenization is called "3D"). Like Samples 1a and 2, Sample 3 was homogenized in an oxidizing atmosphere, but only in one direction (in Table 1, this type of homogenization is called 1D).

The round $TiO_2$—$SiO_2$ glass plates formed from the blanks have a diameter of 30 cm and a thickness d of 5.7 cm (Sample 2) and of 5.1 cm (Sample 3).

These are subjected to an annealing temperature for setting a given fictive temperature. In Sample 2, this treatment is about the same as in Sample 1a (T2$_{annealing}$ is however 930° C. in Sample 2).

In Sample 3, the TiO$_2$—SiO$_2$ glass plate is heated in air and at an atmospheric pressure to 1080° C. for a holding period of 8 hours and is subsequently cooled down at a cooling rate of 4° C./h to a temperature of 980° C. and kept at this temperature for 4 hours. Subsequently, the TiO$_2$—SiO$_2$ glass plate is cooled at a higher cooling rate of 50° C./h to a temperature of 300° C., whereupon the furnace is switched off and the plate is allowed to cool freely in the furnace. The TiO$_2$—SiO$_2$ glass of Sample 3 has a mean fictive temperature of 980° C.

Prior to the next treatment step a layer is removed from the front surfaces and the cylindrical outer surface of the cylindrical Samples, resulting in a diameter of 29.4 cm and a thickness of 5.1 cm each time.

Of Sample 2, both plane sides are polished, and one of the two plane sides in the case of Sample 3.

Samples 4 and 5: Comparative Samples

As explained with reference to Sample 1a, soot bodies of synthetic TiO$_2$—SiO$_2$ glass are produced with different concentrations of TiO$_2$ by flame hydrolysis of OMCTS and titanium-isopropoxide [Ti(OPr$^j$)$_4$]. The concentrations are indicated in Table 1.

The soot bodies of Sample 4 are dehydrated in the same way as Samples 1 to 3. In the soot body of Sample 5 a dehydration treatment is omitted.

The soot bodies are vitrified at about 1500° C. under vacuum (10$^{-2}$ mbar) into transparent blanks of TiO$_2$—SiO$_2$ glass. The mean hydroxyl group content of the TiO$_2$—SiO$_2$ glass of Sample 4 is about 250 wt. ppm; that of Sample 5 is 350 wt. ppm.

Sample 5 is then further processed by thermo-mechanical homogenization (twisting). The oxyhydrogen burner is operated with a stoichiometrically neutral flame during the whole process, i.e. at a molar ratio of oxygen/hydrogen of 1:2. Otherwise, the homogenization of Sample 5 is carried out as described with reference to Sample 1a. In Sample 4, homogenization is omitted.

For setting a given fictive temperature both blanks are subjected to an annealing treatment, as described with reference to Sample 1a. Thereafter, TiO$_2$—SiO$_2$ glass of Sample 4 has a mean fictive temperature of 967° C. and that of Sample 5 has a mean fictive temperature of 952° C. due to its higher hydroxyl group content.

Prior to the next treatment step a layer is removed from the front faces and the cylindrical outer surface of the cylindrical Samples, resulting in a diameter of 29.4 cm and a thickness of 5.1 cm in each case.

Of the two Samples 4 and 5, a plane side is respectively polished.

Specimens were taken from all Samples to determine the dependence of the T$_{ZC}$ on the fictive temperature, as explained with reference to Example 1, and the tangent slope was determined in the range of the mean fictive temperature.

The respective manufacturing parameters and properties of Samples 1a and 2 to 5 are summarized in Table 1. Sample 6 corresponds to the commercially available TiO$_2$—SiO$_2$ glass on which the measurement curve A of FIG. 2 is based. The values of the manufacturing parameters provided with "?" are unknown for that glass.

TABLE 1

| Sample | 1a | 2 | 3 | 4 | 5 | 6 |
|---|---|---|---|---|---|---|
| TiO$_2$ (Gew.-%) | 7.7 | 7.9 | 8.2 | 8.0 | 8.1 | 7.1 |
| T$_{drying}$ (° C.)/t$_{drying}$ (h) | 1050/50 | 1050/50 | 1050/50 | 1050/50 | — | ? |
| OH (wt. ppm) | 248 | 251 | 247 | 252 | 351 | 880 |
| T$_{homogenization}$ (° C.)/extent of homogenization/type of the burner flame | >2000/3D oxidizing | >2000/3D oxidizing | >2000/1D oxidizing | — | >2000/3D nitrogen | — |
| T1$_{annealing}$ (° C.)/t1$_{annealing}$ (h) | 1080/8 | 1080/8 | 1080/8 | 1080/8 | 1080/8 | ? |
| T2$_{annealing}$ (° C.)/t2$_{annealing}$ (h) | 950/4 | 930/4 | 980/4 | 950/4 | 950/4 | ? |
| Mean value of Tf (° C.) | 968 | 945 | 980 | 967 | 952 | 940 |
| Delta Tf (±) | 4 | 4 | 4 | 4 | 5 | 6 |
| dTzc/dTf | 0.19 | 0.08 | 0.27 | 0.33 | 0.42 | 0.62 |
| →dTzc | 1.52 | 0.64 | 2.16 | 2.64 | 4.2 | 7.44 |

The line designated as delta Tf(±) indicates the variation width of the fictive temperature from the measured mean value over the sample thickness. The line designated with dTzc/dTf indicates the differential quotient of the curves A and B, respectively, on the respectively measured mean value of the fictive temperature, and the last line shows the maximum difference of T$_{CZ}$ over the whole sample thickness, determined on the basis of the data from the three lines above it.

Each of Samples 1 to 3 is as such easily usable as a mirror substrate blank with small deformation at an inhomogeneous temperature profile.

A further adaptation to the temperature profile will be achieved when TiO$_2$—SiO$_2$ glasses of a different composition are combined with one another into a mirror substrate blank. This shall be explained in more detail hereinafter.

Production of a Mirror Substrate Blank by Joining Several Shaped Bodies

Example 1

For the adaptation of T$_{ZC}$ to a temperature profile as shown in FIG. 1, a mirror substrate blank is composed of only two layers. Sample 1 and Sample 2 are joined by optical contact bonding with their polished plane sides, resulting in a bubble-free joint based on forces of attraction. This bonded composite is heated in a furnace to a temperature of 1650° C. for a period of 15 min. This yields a melting composite having a low-bubble contact surface, which consists of two zones of identical size that differ in their titanium-oxide concentration, the mean fictive temperature thereof being however about the same.

The melt composite is annealed for eliminating mechanical stresses. The temperature profile during annealing of the melt composite is as follows: heating to a temperature of 1080° C., holding at this temperature for a holding period of 10 h, cooling at a cooling rate of 4° C./h to a temperature of 950° C. and holding at this temperature for a period of 12 h, subsequent free cooling to room temperature.

The mirror substrate blank produced in this way is just composed of two components with a different chemical composition, namely the upper shaped body of Sample 1 and the lower shaped body of Sample 2. These are interconnected through a substantially flat and plane contact surface.

This slight adaptation of the $T_{ZC}$ to the temperature profile of FIG. 1 is enough for ensuring on the whole a small deformation of the mirror substrate at the given temperature profile. The remaining longitudinal expansion during operation is in the range of 0+/−10 ppb/° C. at every point.

The mirror substrate blank serves to produce a mirror substrate of titanium-doped glass for use in EUV lithography. For the production of the mirror substrate, the upper side of the mirror substrate blank that is formed by Sample 1 and exposed to the EUV radiation during the intended use is subjected to a mechanical treatment, including grinding and polishing. The contour of the mirror as a concavely curved surface region is thereby produced.

Comparative Example 1

For the adaptation of the $T_{ZC}$ to a temperature profile as shown in FIG. 1, a mirror substrate blank is built up of two layers on the basis of the procedure described in Example 1. By contrast, instead of Sample 1, Sample 4 is used. The manufacturing method of Sample 4 corresponds to that of Sample 1, but it is not homogenized.

This adaptation of the $T_{ZC}$ is not enough to ensure a slight deformation of the mirror substrate on the whole at the given temperature profile. The remaining longitudinal expansion during operation is above 0+/−20 ppb/° C. in places.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A blank comprising $TiO_2$—$SiO_2$ glass for a mirror substrate for use in EUV lithography, wherein the $TiO_2$—$SiO_2$ glass has a differential quotient $dT_{zc}/dT_f$ of the dependence of its zero crossing temperature $T_{ZC}$ on the fictive temperature $T_f$ of less than 0.3 at a mean value of $T_f$ in a range between 920° C. and 970° C., and wherein the $TiO_2$—$SiO_2$ glass contains between 6 and 9 wt % $TiO_2$.

2. The blank according to claim 1, wherein the differential quotient $dT_{zc}/dT_f$ is less than 0.25.

3. The blank according to claim 1, wherein the $TiO_2$—$SiO_2$ glass has a mean hydroxyl group content in the range of 200-300 wt. ppm.

4. The blank according to claim 1, wherein the $TiO_2$—$SiO_2$ glass has a mean hydrogen concentration of less than $5\times10^{16}$ molecules/cm³.

5. The blank according to claim 1, wherein the blank has an upper side and a bottom side, and wherein the $TiO_2$—$SiO_2$ glass between the upper side and the bottom side has an inhomogeneous titanium oxide concentration profile.

6. The blank according to claim 5, wherein the blank is a composite body comprising a first shaped body comprising $TiO_2$—$SiO_2$ glass having a first titanium oxide concentration and a second shaped body comprising $TiO_2$—$SiO_2$ glass having a second titanium oxide concentration that is connected to the first shaped body.

7. The blank according to claim 6, wherein the first shaped body has a first mean fictive temperature and the second shaped body has a second mean fictive temperature, and wherein the first and the second fictive temperatures are different.

8. The blank according to claim 5, wherein the shaped body is in a form of a plate having a thickness of not more than 60 mm.

9. A method for producing a blank according to claim 1 or a shaped body for the production thereof, the method comprising:
(a) producing a porous soot body of $SiO_2$ having a concentration of titanium oxide by flame hydrolysis of silicon- and titanium-containing start substances,
(b) drying and sintering the soot body to obtain a $TiO_2$—$SiO_2$ glass having the titanium oxide concentration, wherein a mean hydroxyl group content is less than 300 wt. ppm,
(c) homogenizing the $TiO_2$—$SiO_2$ glass in a homogenizing process by heating the $TiO_2$—$SiO_2$ glass in an oxidizing atmosphere to a temperature of more than 2000° C. to soften and reshape the glass and result in a mean hydrogen concentration of less than $5\times10^{16}$ molecules/cm³,
(d) shaping the $TiO_2$—$SiO_2$ glass to obtain a shaped body, and
(e) annealing the shaped body so that the $TiO_2$—$SiO_2$ glass has a differential quotient $dT_{zc}/dT_f$ of the dependence of its zero crossing temperature $T_{ZC}$ on the fictive temperature $T_f$ of less than 0.3 at a mean value of $T_f$ in a range between 920° C. and 970° C.

10. The method according to claim 9, wherein the homogenizing process comprises at least temporarily heating the first $TiO_2$—$SiO_2$ glass with a burner flame which is fed with fuel gas and with at least one oxidizing component in an excess amount for the complete combustion of the fuel gas.

* * * * *